(12) United States Patent
Yasui et al.

(10) Patent No.: US 8,741,110 B2
(45) Date of Patent: Jun. 3, 2014

(54) METHOD OF FORMING A FILM

(75) Inventors: Nobuhiro Yasui, Kawasaki (JP); Ryoko Horie, Yokohama (JP); Toru Den, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 955 days.

(21) Appl. No.: 11/741,918

(22) Filed: Apr. 30, 2007

(65) Prior Publication Data

US 2007/0256925 A1    Nov. 8, 2007

(30) Foreign Application Priority Data

May 8, 2006   (JP) ................. 2006-129297

(51) Int. Cl.
*C23C 14/34* (2006.01)
(52) U.S. Cl.
USPC ............. 204/192.15; 204/192.13; 204/192.3
(58) Field of Classification Search
USPC ............................ 204/192.12, 192.15, 192.3
See application file for complete search history.

(56) References Cited

U.S. PATENT DOCUMENTS

| | | | |
|---|---|---|---|
| 5,858,471 A | 1/1999 | Ray et al. | |
| 6,187,151 B1 * | 2/2001 | Leiphart | 204/192.3 |
| 6,316,359 B1 * | 11/2001 | Simpson | 438/678 |
| 2006/0292867 A1 * | 12/2006 | Kim | 438/667 |

FOREIGN PATENT DOCUMENTS

| | | |
|---|---|---|
| JP | 4-127527 A | 4/1992 |
| JP | 09-501612 A | 2/1997 |

OTHER PUBLICATIONS

"Handbook of Refractory Carbides and Nitrides." Pierson, Hugh O. Noyes Publications, Dec. 1996.*
S. Berg et al., Preferential sputtering effects in thin film processing, J. Vac. Sci. Techol. A, vol. 17, No. 4, pp. 1916 to 1925, (1999).
Office Action issued in Japanese Patent Application No. 2006-129297 (Feb. 23, 2012), with English translation (4 pages).

* cited by examiner

*Primary Examiner* — Keith Hendricks
*Assistant Examiner* — Jason M Berman
(74) *Attorney, Agent, or Firm* — Fitzpatrick, Cella, Harper & Scinto

(57) ABSTRACT

A method of forming a film, including the steps of preparing a base plate having a first region and a second region comprised of mutually different materials wherein at least one of the materials is an oxide and selectively conducting a film deposition on either one of the first region and the second region by a bias sputtering. Both the first and second regions can be formed of an oxide. Further, provided is a vapor film deposition method including irradiating a substrate having a plurality of regions of different constituent element groups composed of at least one element with a source material element group composed of at least one element to be deposited and ionized elements.

5 Claims, 6 Drawing Sheets

METHOD OF FORMING A FILM

BACKGROUND OF THE INVENTION

1. Field of the Invention

The present invention relates to a vapor film deposition method, and more particularly, to a method of forming a film, for which an effect of ion particles as well as that of deposition elements are applied.

2. Description of the Related Art

In recent years, there has been a growing interest in a fine-structured material as a functional material. An example of a procedure of producing such a fine-structured material includes a method of producing a fine-structured material directly by a semiconductor processing technique typified by a fine pattern forming technique such as photolithography. Selective deposition or application of a particular material to such a pattern is a technique that is gaining interest due to its great effect on a reduction in number of processes.

As the conventional selective growth or selective film deposition, a chemical vapor deposition (CVD) method is mainly exemplified. According to the CVD, a source material gas is formed into a radical with heat, light, plasma, or the like to enhance reactivity, whereby the source material gas is deposited at a particular place. On the other hand, a process of physical deposition is referred to as physical vapor deposition (PVD).

It is described in "J. Vac. Sci. Technol.", A, Vol. 17, No. 4, pp. 1916 to 1925, July/August, 1999" that selective film deposition is performed by sputtering that is one of the PVD.

The above-mentioned document describes that aluminum (Al) is deposited on a base plate composed of an Si region and a W (tungsten) region, using Ar ions at an acceleration voltage of 500 eV, and also describes that Al can be deposited selectively only in the Si region in such a case.

However, through studies of Al deposition on a base plate having an $SiO_2$ region and a $Ta_2O_5$ region at an acceleration voltage of 500 eV with reference to "J. Vac. Sci. Technol. "A, Vol. 17, No. 4, pp. 1916 to 1925, July/August, 1999", it was found that selective sputtering cannot be performed.

SUMMARY OF THE INVENTION

It is therefore an object of the present invention to provide a method of forming a film, which realizes selective sputtering on a base plate having an oxide region.

According to an aspect of the present invention, there is provided a method of forming a film, including the steps of: preparing a base plate having a first region and a second region composed of mutually different materials, at least one of the materials being an oxide; and selectively depositing a film in either one of the first oxide region and the second oxide region by a bias sputtering.

Both the first and second regions can be an oxide.

A material to be deposited by the bias sputtering can be a metal material.

A film can be deposited by the bias sputtering at an acceleration voltage of 100 eV or less.

Further, the present invention relates to a vapor film deposition method including irradiating a substrate having a plurality of regions of different constituent element groups composed of at least one element with a source material element group composed of at least one element to be deposited and ionized elements. The vapor film deposition method is a selective film deposition method involving depositing the source material element group only in a region comprised of a particular constituent element group on the substrate, without generating a sub-product.

Further, the above-mentioned film deposition method is characterized in that the ionized elements include at least one noble gas element.

Further, the above-mentioned film deposition method is sputtering.

Further, the above-mentioned film deposition method is characterized in that the irradiation of the ionized elements is achieved by guiding a noble gas ion being a process gas of the sputtering to a substrate side by the application of a bias to the substrate.

Further, in the above-mentioned film deposition method which is a selective film deposition method, the ionized elements are perpendicularly applied onto the substrate under a condition that a deposition element group (a) is deposited by 0.3 nm on a constituent element group of a region $R_n$ [n=1, 2, 3 . . .] on the substrate comprised of a plurality of regions of different constituent element groups. A rate $R_{n-a}$ [n=1, 2, 3 . . .] of sputtering of the deposition element group (a) on the region $R_n$ is numerized in each region. At this time, if any ratio of the rates has a difference of 1.2 times or more, the irradiation amount of the deposition element group (a) and the irradiation amount of ions are optimized between the regions $R_n$, whereby a deposition/non-deposition regions of the deposition elements can be constituted.

Further, regarding the irradiation amount of the deposition element group (a) and the irradiation amount of the ions, an irradiation amount $S_a$ [atoms/sec·nm$^2$] of the element group (a) and an irradiation amount $G_{ion}$ [ions/sec·nm$^2$] of ions to the substrate are defined. In addition, the sputtering rates in one region $R_n$ and another region $R_{n'}$ on the substrate are respectively defined as $R_{n-a}$ [atoms/ion] and $R_{n'-a}$ [atoms/ion] ($R_{n-a}/R_{n'-a}$>1.2). In this case, the following relationships are established.

$$S_a[\text{atoms/sec·nm}^2] < R_{n-a}[\text{atoms/ion}] \cdot G_{ion}[\text{ions/sec·nm}^2]$$

$$S_a[\text{atoms/sec·nm}^2] > R_{n'-a}[\text{atoms/ion}] \cdot G_{ion}[\text{ions/sec·nm}^2]$$

The above-mentioned film deposition method is a selective film deposition method characterized by the condition described above.

Further, under the condition that the deposition element (a) is deposited by 0.3 nm in an arbitrary region $R_n$ on the substrate, the sputtering rate $R_{n-u}$ [atoms/ion] of the constituent elements of the region $R_n$ and the sputtering rate $R_{n-a}$ [atoms/ion] of the deposition element group (a) are defined. In this case, a material is selected so that the relationship $R_{n-a}/R_{n-u}$>1 is established.

Further, the above-mentioned film deposition method is a selective film deposition method characterized in that the sputtering rates $R_{n-a}$ and $R_{n-u}$ are calculated by numerical calculation to select a material.

Further, according to another aspect of the present invention, there is provided a recording medium which stores information in the form of a database, the information being obtained by calculating the sputtering rates $R_{n-a}$ [atoms/ion] and $R_{n-u}$ [atoms/ion] by the numerical calculation with respect to an indefinite number of materials.

According to the present invention, there can be provided a method of forming a film, which realizes selective sputtering on a base plate having an oxide region.

Further features of the present invention will become apparent from the following description of exemplary embodiments with reference to the attached drawings.

DESCRIPTION OF THE EMBODIMENTS

Figure 1:
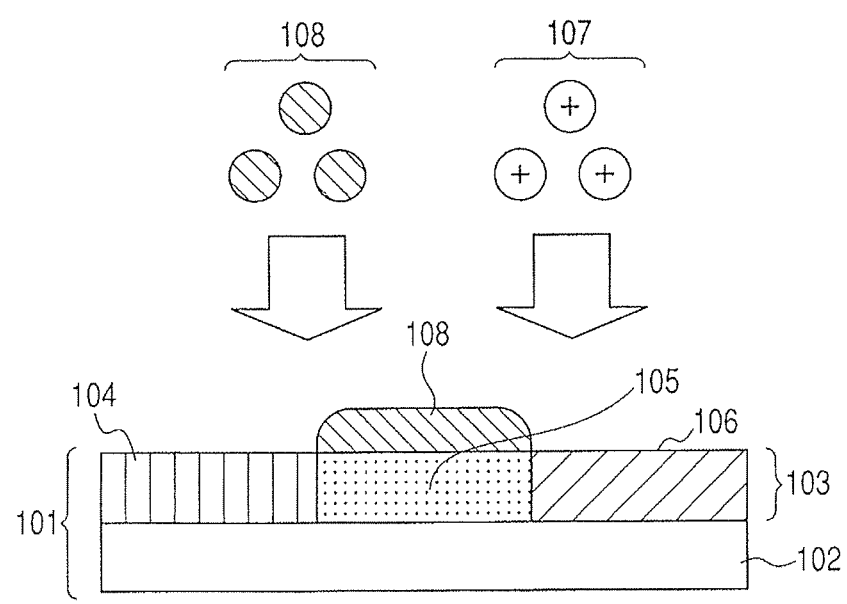
FIG. 1 is a schematic view of a film obtained by selective film deposition of the present invention.

A method of forming a film of the present invention, which realizes selective sputtering and detailed conditions thereof will be described with reference to the drawings.

According to studies made by the inventors of the present invention, in "J. Vac. Sci. Technol. "A, Vol. 17, No. 4, pp. 1916 to 1925, July/August, 1999", selective sputtering is realized by providing a clear difference in a film deposition rate between two regions (Si and W), using a state of a very high film deposition rate (in a case where a film is deposited).

However, the inventors of the present invention have come to recognize that in attempting to deposit a film on an oxide region at an acceleration voltage of 500 eV, a remarkable difference is not caused in film deposition rate even between different oxides particularly because density of an oxide is relatively lower than that of metal.

Thus, the inventors of the present invention have completed the present invention which is capable of realizing film deposition by selective sputtering on either one of regions of oxides when a film is deposited at a very low voltage (e.g., 50 eV) compared with the above-mentioned acceleration voltage. Actually, a film can be sputtered selectively on an oxide at 100 eV or less. Considering a film deposition rate, 5 eV or more can be practically used. In particular, in the case where both sides of a first region composed of a first material are sandwiched or surrounded by a second region composed of a second material, the present invention can be preferably applied in the case where the first region has a size of 100 nm or less. For example, the present invention is effective in the case where a concave portion made of an oxide between oxide regions with an interval of 100 nm is filled with a metal material.

More specifically, the present invention is applicable to the case where a concave portion made of an oxide such as silicon is filled with a metal (aluminum, copper, etc.) to be wiring in a semiconductor process, and is a process replacing a filling process through plating. Considering film deposition rate, the present invention can be applied in a process in which the wiring interval is 100 nm or less (e.g., 10 nm or more to 50 nm or less).

This is mainly because a film deposition material and Ar ions against the base plate.

For example, in the case of an acceleration voltage of 500 eV, the difference between the rate of re-sputtering (which means that a deposited film is peeled) of Al deposited on $SiO_2$ by Ar ions and the rate of re-sputtering of Al on $Ta_2O_5$ is estimated to be about twice. The re-sputtering rate is higher on $Ta_2O_5$ In contrast, when the acceleration voltage is decreased to about 50 eV, the difference in the re-sputtering rates is 20-folds between them.

According to the present invention, selective sputtering on an oxide region is realized by utilizing the above-mentioned fact.

In the present invention, selective sputtering is performed on a base plate having at least two regions (one of which is composed of an oxide). Needless to say, both the regions may be composed of an oxide (provided that materials are different from each other).

Hereinafter, the present invention will be described specifically.

The structure of a film obtained by a film deposition method of the present invention will be described in detail with reference to FIG. 1.

A substrate 101 has an indefinite number of regions $R_n$ [n=1, 2, 3, . . . ] 103 formed on a base plate 102. For example, reference numerals 104, 105, and 106 respectively denote from the left regions $R_1$, $R_2$, and $R_3$ having different constituent element groups. The regions $R_n$ [n=1, 2, 3, . . . ] 103 of the base plate 101 are irradiated with gas species ions 107 and a deposition element group (a) 108. Consequently, in the regions $R_n$ [n=1, 2, 3, . . . ] 103 having different constituent element groups, the deposition element group (a) 108 is deposited only in the region $R_2$ 105 under the condition described later. This is the film structure obtained by the selective film deposition of the present invention.

Figure 2A:
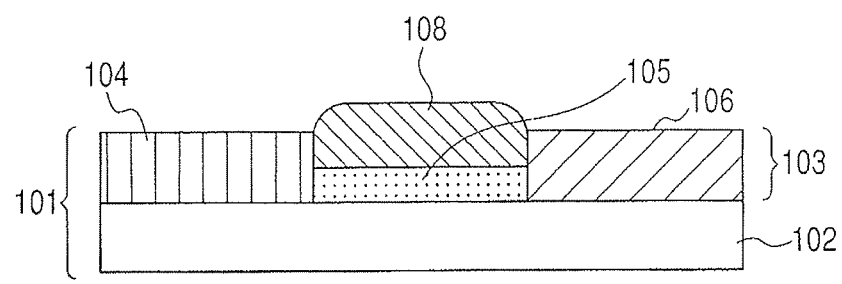
FIGS. 2A and 2B are schematic views each illustrating an exemplary embodiment which a region of the present invention can take.
Figure 2B:
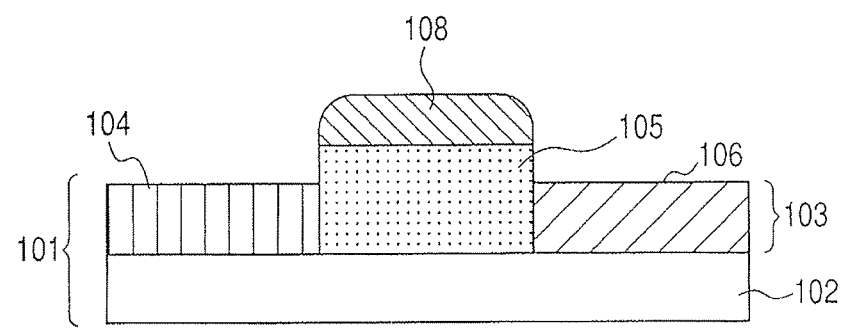
Figure 3:
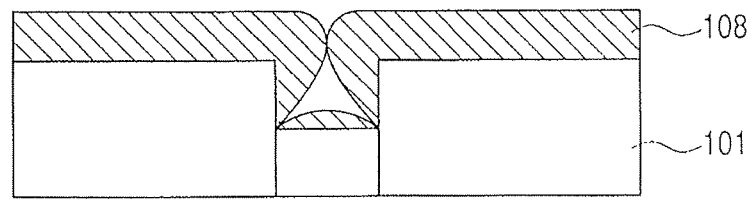
FIG. 3 is a schematic view illustrating a cross-section after a film is deposited in a concave portion in a conventional example.

Further, the above-mentioned deposition is not limited to the case where the regions $R_n$ [n=1, 2, 3, . . . ] 103 on the substrate 101 are prepared to be smooth as illustrated in FIG. 1. Even in the case where the region $R_2$ 105 is recesses with respect to the regions $R_1$ 104 and $R_3$ 106 as illustrated in FIG. 2A, or where the region $R_2$ 105 is projected with respect to the regions $R_1$ 104 and $R_3$ 106 as illustrated in FIG. 2B, the deposition element group (a) 108 can be deposited selectively only in the region $R_2$ 105. Although the applicability varies since the deposition is selective, the deposition is effective as a burying means since the element group can be adhered to only the recessed portion. Generally, as illustrated in FIG. 3, the adhesion of a material proceeds around an inlet of a recessed portion and the material is difficult to be buried in the recessed portion satisfactorily, so the deposition is considered to be effective for wiring and the like, in particular.

Here, the deposition element group (a) 108 may be any element as long as the substrate 101 can be irradiated with the element, and may be composed of a plurality of elements without being limited to a single element material. It should be noted that organometallic materials used for a chemical vapor deposition (CVD) method are excluded. In particular, the substrate 101 can be irradiated with the deposition element group (a) 108 from a target by a sputtering phenomenon.

Further, regarding irradiation of the gas species ions 107, noble gas based gas species are used since the method does not involve reactive film deposition. Examples thereof include He, Ne, Ar, Kr, and Xe.

Further, any substrate can be used as the substrate 101 without any limit as long as the regions $R_n$ [n=1, 2, 3, . . . ] 103 can be formed thereon. Various materials such as a semiconductor base plate made of Si, Ge, GaAs, etc., an oxide base plate of glass, quartz, sapphire, etc., and a plastic base plate can be used for the substrate.

Further, although the condition of selective film deposition will be described later, each region may be comprised of a single element or a multi-element system, depending upon the selection of a material for the regions $R_n[n=1, 2, 3, \ldots]$ 103. The regions $R_n$ may be comprised of a metal, a metal alloy, a semiconductor, an oxide, a nitride, a boride, or the like.

Particularly, according to the present invention, at least one of the regions $R_n$ is preferably comprised of an oxide. Specific examples of the oxide include $Al_2O_3$, $MgO$, $SiO_2$, $TiO_2$, $GeO_2$, $Nb_2O_5$, $ZrO_2$, $ZnO$, $Y_2O_3$, $SnO_2$, $In_2O_3$, $WO_3$, $Ta_2O_5$, and $HfO_2$, and other oxides are also applicable. Examples of the structure of the regions $R_n$ include regions all composed of an oxide, regions composed of an oxide and metal, and regions composed of a semiconductor, a nitride, a boride, or a carbide. Further, a combination of nitrides is effective instead of a combination of metals or semiconductors as in the prior art.

Figure 4:
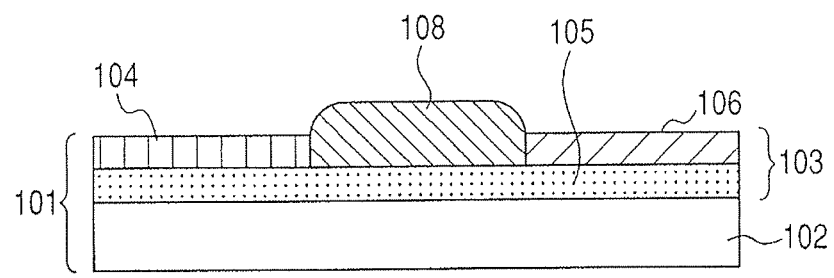
FIG. 4 is a schematic view illustrating an exemplary embodiment which the region of the present invention can take.

Further, although each film thickness of the regions $R_n$ [n=1, 2, 3, . . . ] 103 varies depending upon the energy of ions to be applied, about 4 nm film thickness at an energy of 100 eV and about 2 nm film thickness at an energy of 50 eV enable the effect of the present invention to be exhibited sufficiently. That is, even in the case where the regions $R_n$ are applied in a multi-layer coating as illustrated in FIG. 4 without being sectioned as illustrated in FIGS. 1, 2A, and 2B, the same effect can be obtained. However, in FIG. 4, even with respect to the regions $R_1$ 104 and $R_3$ 106 where the deposition element group (a) 108 is not deposited, in the case where the film thicknesses are as thin as 2 nm, the deposition element group (a) 108 is slightly sputtered. Because of this, regions may be lost during film deposition over a long period of time, so film deposition needs to be performed carefully.

Further, the present invention can be applied to such a structure that some regions $R_n$ [n=1, 2, 3, . . . ] 103 with the above-mentioned thicknesses are patterned, favorably at a pattern interval of 2 nm or more. For the regions with a larger interval the present invention is applicable without any limitation.

Further, the energy of the gas species ions 107 may be accelerated to a desired energy at the outlet of an ion gun or the like. Further, particularly, in the case where ions are introduced into a substrate by using a base plate bias from a sputtering target, a bias can be applied to the base plate. The base plate bias may be a DC bias or an RF bias. Needless to say, only the RF bias exhibits an effect with respect to an insulating base plate composed of an oxide or the like. Therefore, in such a case, an effective one is selected.

Next, selective growth of the present invention will be described in detail.

In the conventional film deposition by sputtering, in the case where material elements sputtered from a target by a sputtering phenomenon are deposited on a substrate, the promotion of diffusion or re-sputtering is caused by the application of a bias to the base plate. With this, an attempt has been made to enhance the degree of adhesion and flatness of a film. However, attempts of patterning or selective growth or selective film deposition have not been reported. However, the inventors of the present invention have studied earnestly and found that in the case where a region constituting a substrate is composed of a plurality of regions in a deposition process of a material to the substrate, selective growth can be achieved, without any limit to the currently used sputtering apparatus.

Figure 5:
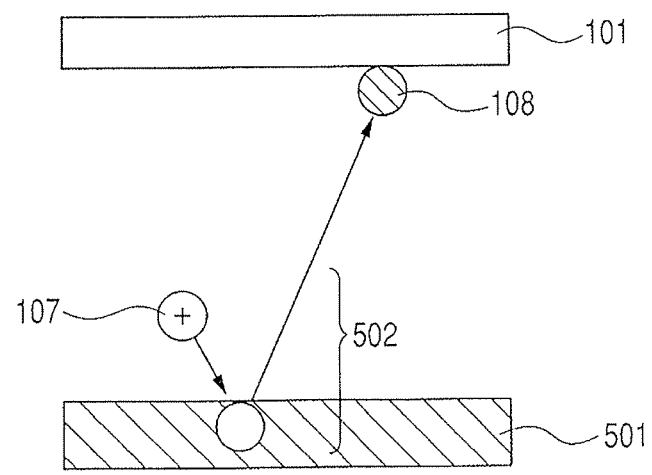
FIG. 5 is a conceptual view illustrating film deposition by a sputtering phenomenon.

First, as illustrated in FIG. 5, sputtering is a general phenomenon. In particular, according to the sputtering phenomenon of the present invention, the gas species ions 107 are accelerated by an electric field, a magnetic field, or the like, and the deposition element group (a) 108 is sputtered from a target. An apparatus using this phenomenon is a sputtering apparatus. The film deposition by sputtering refers to deposition of a material sputtered from a target to a substrate. Herein, particles for sputtering the deposition element group (a) 108 from the target are referred to as a process gas. As the process gas, generally, an inactive gas such as He, Ne, Ar, Kr, or Xe is used in a sputtering apparatus. In particular, Ar can be favorably used. In the reactive sputtering, $N_2$, $O_2$ and other gas species are used. Further, the process gas ionized through discharging is accelerated toward the target, and the deposition element group (a) 108 is ejected out of the target.

Figure 6A:
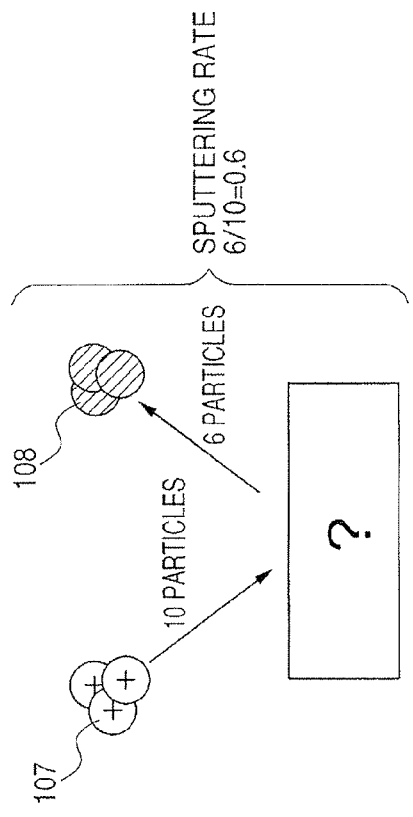
FIGS. 6A and 6B are conceptual views illustrating a difference in sputtering rate between the conventional example and the present invention.

Further, according to the substrate bias effect, a bias is applied to a base plate and a part of the ionized process gas is introduced into a substrate side, whereby the diffusion of the deposition element group (a) 108 on the substrate is promoted by the collision of the accelerated process gas and a film is made dense. Further, depending upon the energy of collision, the deposition element group (a) 108 may be re-released from the substrate. Regarding the rate at which the deposition element group (a) 108 is ejected out of the target or the re-release process thereof, such an index as a sputtering rate is generally used as a parameter. The sputtering rate refers to how many target particles are sputtered with respect to the incidence of one particle of the gas species ion 107 or process gas, and varies depending upon the energy of the process gas. The conventionally known sputtering rate refers to a rate representing the situation as illustrated in FIG. 6A, which indicates the ratio of the number of the deposition element group (a) 108 that has been ejected out from the target with respect to the number of incident particles (number of the gas species ions 107). For example, if the process gas is Ar and the target is Si, the sputtering rate is expressed as 0.6 at 500 eV.

Figure 6B:
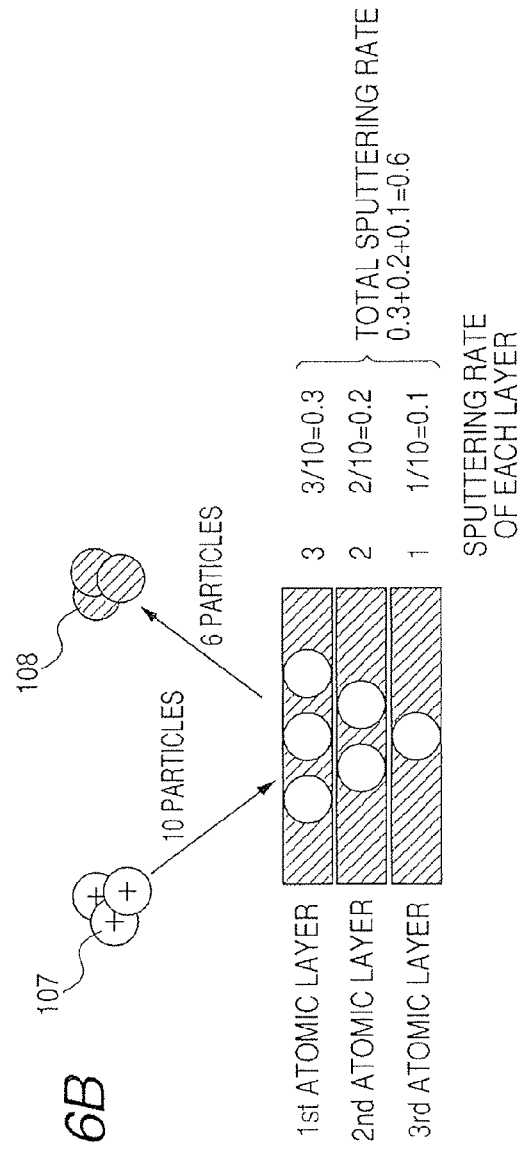
Figure 7A:
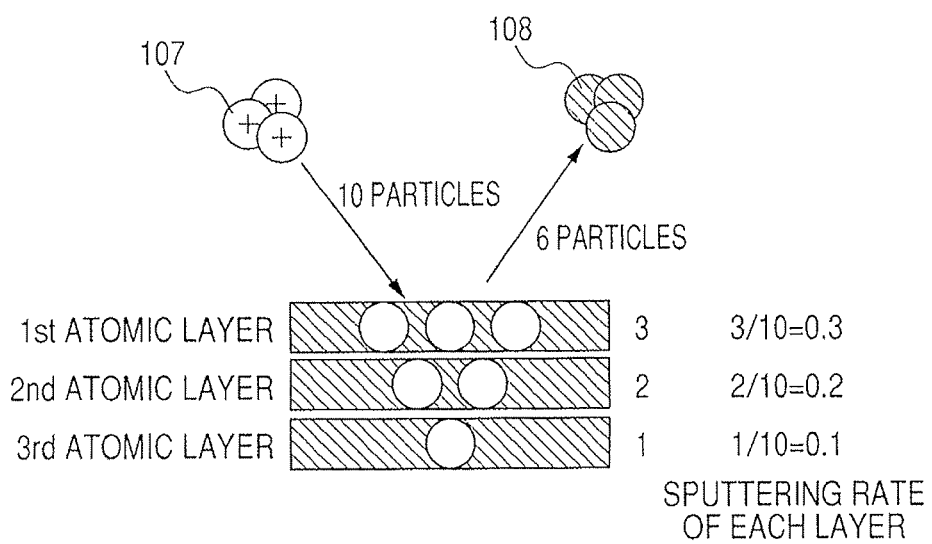
FIGS. 7A and 7B are conceptual views illustrating a sputtering rate in the present invention in detail.
Figure 7B:
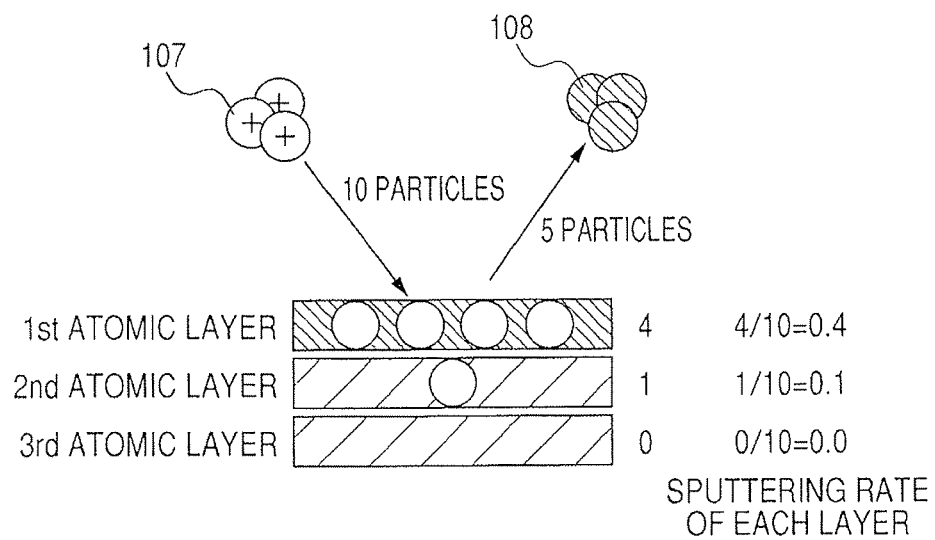

However, in studying the phenomenon in detail considering a first atomic layer, a second atomic layer, . . . provided in the stated order from an outermost surface of the target as in the conceptual view of FIG. 6B, the inventors of the present invention have found that the sputtering rate varies in the respective layers. That is, even when the conventional sputtering rate is 0.6 as a whole, the rate in each layer remains unclear. Owing to the earnest study by the inventors of the present invention, the sputtering rate can be individually expressed in terms of the first atomic layer, the second atomic layer, . . . from the outermost layer. More specifically, the conventional sputtering rate is an index with which the detail of the phenomenon is not clear, and hence, expresses the rate irrespective of the situation of a surface one layer. Thus, the inventors of the present invention have come to consider the sputtering rate of one surface layer. For example, when the process gas is Ar and the energy thereof is 50 eV, Si has a sputtering rate of $2.20 \times 10^{-3}$ according to the conventional indication method. However, the surface first layer has a sputtering rate of $1.77 \times 10^{-3}$. This is apparent from the conceptual view of FIG. 7A, which illustrates that the sputtering rate of the first layer is different from that of the entire layers. This concept can be developed as follows. In the case where the second atomic layer and subsequent layers are composed of a different kind of element (e.g., Si (first layer)/Pt (second and subsequent layers)) as illustrated in FIG. 7B, the sputtering rate of Si constituting the first atomic layer is $2.01 \times 10^{-1}$. What is important here is that the conceptual views of FIGS. 7A and 7B merely illustrate the difference between 0.3 and 0.4 in the sputtering rate of the first atomic layer. However, the inventors of the present invention have made earnest studies and have consequently found that there is a difference in the sputtering rates by 100-fold or more ($1.77 \times 10^{-3}$ and $2.01 \times 10^{-1}$) between Si of the surface one layer on Si and Si of the surface one layer on Pt. This is related to the surface one layer. Therefore, according to the numerical value indicated here, Si on Pt is calculated to be 0.3 nm. However, when Si on Pt becomes as thick as about 2 nm, the value becomes close to that of Si on Si in the energy region of 50 eV, and no difference is caused. The above-mentioned circumstances are considered to reflect the difference in bond strength between Si and Si and Si and Pt, as well as the condition that ions are more reflected by Pt being a heavier element to sputter depositing Si again. The thickness of about 2 nm corresponds to the case where the process gas Ar is at about 50 eV, and the thickness is not limited thereto when the process gas Ar has a larger energy. It should be noted that the concept of principle and phenomenon will not be changed.

As descried above, the effective use of the difference in sputtering rate of the surface one layer is an essential part of the present invention. That is, the rate of re-release of the surface one layer by the irradiation of ions or application of a bias to the base plate is used, whereby selective film deposition can be achieved between particular elements. For example, in the case where a partial region of a substrate is comprised of Si and the other regions are comprised of Pt, the base plate bias is adjusted in depositing Si, whereby selective deposition only on Si can be performed. That is, the condition that during the initial deposition of Si onto a substrate, there is a 10-fold or more difference in the sputtering rate ($1.77 \times 10^{-3}$ and $2.01 \times 10^{-1}$) between Si on Si and Si on Pt is used. This is the essence of selective growth and selective film deposition of the present invention. It should be noted that it is too late when ions or a bias is applied to a base plate after the deposition of Si, and it is necessary to apply ions or a bias from when a surface one layer is being formed by the deposition of Si. Although the condition of selective growth will be described later, in the conventional sputtering apparatus or film deposition with a view to increasing the deposition rate, the deposition rate is sufficiently higher than that of the re-release by the application of a bias, so this phenomenon cannot be recognized. Thus, the above description is considered to be the main factors of the delay in achieving the selective growth of the present invention with higher selectivity unlike the prior art.

Next, the condition for achieving the selective growth of the present invention will be described in detail.

First, a plurality of regions $R_n$ [n=1, 2, 3, ... ] 103 constituting a substrate are defined. The regions $R_n$ [n=1, 2, 3, ... ] 103 are determined based on the assumption that the constituent element groups are different from each other. Further, as illustrated in the conceptual view of FIG. 8, the situation is assumed or prepared, in which the deposition element group (a) 108 to be deposited onto the regions $R_n$ [n=1, 2, 3, ... ] 103 is deposited in a thickness of 0.3 nm (approximated as the thickness of the first atomic layer). The sputtering rates $R_{n-a}$ 801 of the deposition element group (a) 108 in the regions $R_n$ [n=1, 2, 3, ... ] 103 obtained in the case where the gas species ions 107 are applied with a certain energy are calculated and numerized by simulation or actual measurement. The reason the deposition element group (a) 108 is deposited in a thickness of 0.3 nm is that the thickness of the first atomic layer is approximated to 0.3 nm.

For example, $R_{n-Si}$ in the case where Si is selected as the deposition element group (a) 108, and Mg, Al, Si, Ti, V, Cr, Mn, Fe, Co, Ni, Cu, Zn, Ge, Zr, Nb, Mo, Ru, Rh, Pd, Ag, Cd, In, Sn, Sb, Hf, Ta, W, Re, Os, Ir, Pt, Au, Pb, and Bi are selected for the regions $R_n$ [n=1, 2, 3, ... ] 103 are shown in Tables 1 and 2 below. Further, $R_{n-Si}$ in the case where $Al_2O_3$, MgO, $SiO_2$, $TiO_2$, $GeO_2$, $Nb_2O_5$, $ZrO_2$, ZnO, $Y_2O_3$, $SnO_2$, $In_2O_3$, $WO_3$, $Ta_2O_5$, and $HfO_2$ are selected as the regions Rn [n=1, 2, 3, ... ] 103 composed of an oxide is shown in Table 2 below. The sputtering rates $R_{n-Si}$ as used herein refer to that of Si of 0.3 nm deposited in the region Rn, and needless to say, represents the sputtering rate from the surface 0.3 nm even in the case where the regions $R_n$ [n=1, 2, 3, ... ] 103 are composed of Si. Further, the numerical values shown in the tables are obtained under the condition that the gas species ions 107 are comprised of Ar and the incidence is perpendicular to the substrate with an energy of 50 eV. Herein, a high sputtering rate indicates that the Si are hardly deposited on the regions $R_n$ [n=1, 2, 3, ... ] 103, while a low sputtering rate indicates that the Si are easily deposited on the regions $R_n$ [n=1, 2, 3, ... ] 103, when gas species ions are exposed.

TABLE 1

| ELEMENT IN REGION $R_n$ | SPUTTERING RATE $R_{n-Si}$ |
| --- | --- |
| Mg | 9.64E−04 |
| Al | 1.87E−03 |
| Si | 1.77E−03 |
| Ti | 9.04E−03 |
| V | 1.34E−02 |
| Cr | 1.65E−02 |
| Mn | 1.89E−02 |
| Fe | 1.99E−02 |
| Co | 2.40E−02 |
| Ni | 2.30E−02 |
| Cu | 2.80E−02 |
| Zn | 2.56E−02 |
| Ge | 2.83E−02 |
| Zr | 5.81E−02 |
| Nb | 6.60E−02 |
| Mo | 7.78E−02 |
| Ru | 8.90E−02 |
| Rh | 9.09E−02 |
| Pd | 9.07E−02 |
| Ag | 9.06E−02 |
| Cd | 9.15E−02 |
| In | 8.64E−02 |
| Sn | 9.10E−02 |
| Sb | 8.79E−02 |
| Hf | 1.64E−01 |
| Ta | 1.88E−01 |
| W | 2.00E−01 |
| Re | 1.98E−01 |
| Os | 1.96E−01 |
| Ir | 1.91E−01 |
| Pt | 2.01E−01 |
| Au | 2.19E−01 |
| Pb | 1.54E−01 |
| Bi | 1.40E−01 |

TABLE 2

| ELEMENT IN REGION $R_n$ | SPUTTERING RATE $R_{n-Si}$ |
| --- | --- |
| $Al_2O_3$ | 7.29E−04 |
| MgO | 4.77E−04 |
| $SiO_2$ | 5.63E−04 |
| $TiO_2$ | 2.28E−03 |
| $GeO_2$ | 8.52E−03 |
| $Nb_2O_5$ | 1.64E−02 |
| $ZrO_2$ | 1.88E−02 |
| ZnO | 1.01E−02 |
| $Y_2O_3$ | 1.89E−02 |
| $SnO_2$ | 3.11E−02 |

TABLE 2-continued

| ELEMENT IN REGION $R_n$ | SPUTTERING RATE $R_{n-Si}$ |
|---|---|
| $In_2O_3$ | 3.48E-02 |
| $WO_3$ | 4.24E-02 |
| $Ta_2O_5$ | 4.90E-02 |
| $HfO_2$ | 5.46E-02 |

The expression of the above-mentioned constituent element group and deposition element group refers to that at least one element is contained. Thus, the expression is not limited to the selection from only single element, but is applicable to all the cases where the sputtering rate of an oxide or a nitride such as an alloy of various kinds of compositions can be calculated.

Figure 8:
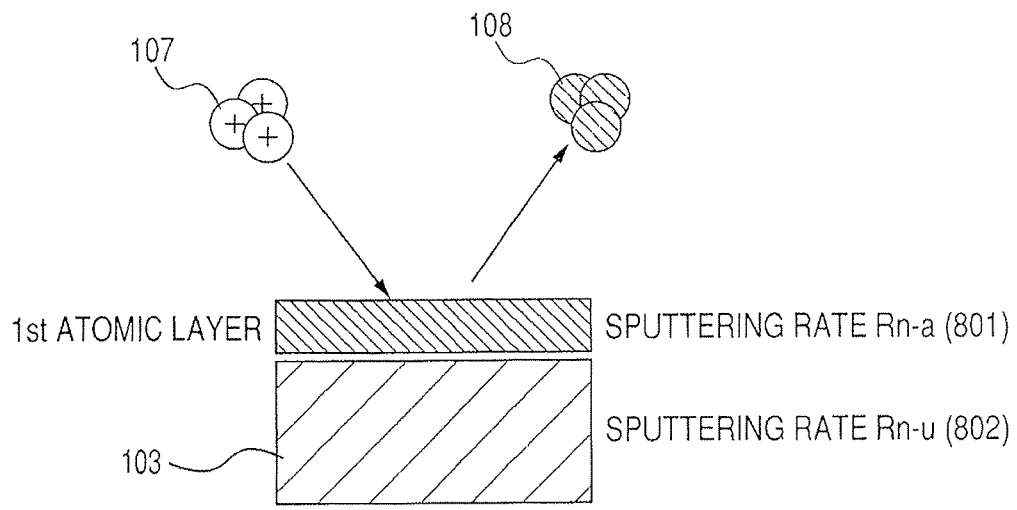
FIG. 8 is a conceptual view illustrating a definition of a sputtering rate used in the present invention.
Figure 9:
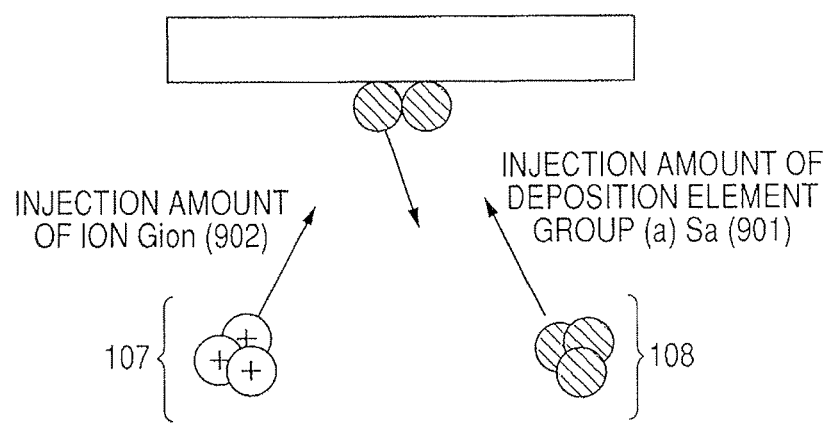
FIG. 9 is a conceptual view illustrating a state on a substrate on which selective film deposition of the present invention is to be performed.

Further, as illustrated in FIG. 9, the irradiation amount of the deposition element group (a) 108 to be deposited on the substrate is taken to be $S_a$ [atmos/sec·nm$^2$] 901. The irradiation amount represents the degree of injection per unit time and unit area of the deposition element group (a) 108 sputtered from a target to the substrate. Further, the irradiation amount of the gas species ions 107 to the substrate is taken to be $G_{ion}$ [ions/sec·nm$^2$] 902. Further, the sputtering rates in one region $R_n$ and another region $R_{n'}$ on the substrate are expressed as $R_{n-a}$ [atoms/ion] and $R_{n'-a}$ [atoms/ion], respectively, in accordance with notation illustrated in FIG. 8. As the first important conclusion of the present invention, $R_{n-a}/R_{n'-a}>1.2$ is important at least for achieving the selective growth.

More desirably, $R_{n-a}/R_{n'-a}>2.0$ is satisfied. As the difference is larger, a larger margin of a process can be taken, whereby the variation in deposition elements and irradiation ions can be absorbed easily.

Herein, in the case of taking the ratio, the condition of taking a larger value as a numerator is necessary.

That is, if the sputtering rates in a case where the deposition element group (a) 108 is Si are viewed, the sputtering rate of Si on Ti is $9.04 \times 10^{-3}$ and that of Si on Pt is $2.01 \times 10^{-1}$. The ratio thereof is 22.2, which satisfies the above-mentioned condition, so it can be determined that this combination is one of the effective combinations for constituting a plurality of regions on a substrate. Further, the sputtering rate of Si on Ru is $8.90 \times 10^{-2}$, and that of Si on Ta is $1.88 \times 10^{-}$. The ratio thereof is 2.11, which sufficiently satisfies the above-mentioned condition, so it can be determined that this combination is also suitable for selective growth. Then, by optimizing the irradiation amount of ions, the situation in which Si is deposited on Ti while Si is not deposited on Pt can be achieved. Further, the ratio between the sputtering rate of Si on Pt and the sputtering rate of Si on Ta is 1.07. This ratio does not satisfy the above-mentioned determination standard. Therefore, in the case where Pt and Ta are adopted as a combination of substrate constituent elements, the possibility of selective growth of the present invention is determined to be very low. The above-mentioned ratio is obtained in the case where the process gas is argon, so the ratio varies in a case where other gas species ions 107 are used.

Subsequently, a second important conclusion of the present invention is as follows:

$$S_a[\text{atoms/sec·nm}^2] < R_{n-a}[\text{atoms/ion}] \cdot G_{ion}[\text{ions/sec·nm}^2]$$

$$S_a[\text{atoms/sec·nm}^2] > R_{n'-a}[\text{atoms/ions}] G_{ion}[\text{ions/sec·nm}^2]$$

where $R_{n-a} > R_{n'-a}$ is satisfied.

The above-mentioned equations define a relationship between the release rate representing the degree of release of the re-sputtered deposition element group (a) 108 from the regions $R_n$ [n=1, 2, 3, ...] 103 on the substrate caused by incident ions and the deposition rate of the deposition element group (a) 108. That is, if the gas species ions 107 are argon, $R_{n-a}$ and $R_{n'-a}$ are uniquely determined, so the above-mentioned expressions suggest that it is necessary to optimize $G_{ion}$ 902 or $S_a$ 901 for selective growth. Actually, in the case where the process gas is argon, if the current flowing in an area with a diameter of 101.6 mm (4 inches) when applying a substrate bias corresponding to 50 eV is measured and found to be 0.1 A, it is determined that 77.1 [ions/sec·nm$^2$] argon ions are made incident upon the substrate. At this time, since the sputtering rate of Si on Pt is $2.01 \times 10^{-1}$ [atoms/ion], the release rate is calculated to be 15.50 [atoms/sec·nm$^2$] by multiplication. Further, since the sputtering rate of Si on Ti is $9.04 \times 10^{-3}$ [atoms/ion], the release rate is 0.70 [atoms/sec·nm$^2$] by multiplication. As a result, by setting the condition so that the deposition rate of Si, which is a deposition element, satisfies $0.70 < S_a < 15.50$, selective growth can be achieved in which Si is deposited on Ti and Si is not deposited on Pt. Further, since the sputtering rate of Si on Si is $1.77 \times 10^{-3}$, once Si is deposited on Ti, the deposition proceeds as it is.

Next, another selection of a material according to the present invention will be described.

In addition to the sputtering rate ($R_{n-a}$ 801) of the deposition element group (a) 108, the condition where the deposition element group (a) 108 is deposited to 0.3 nm in the regions $R_a$ [n=1, 2, 3, ...] 103 is assumed by numerical calculation. Then, the sputtering rate (defined as $R_{n-u}$ 802) of the element group constituting the regions $R_n$ [n=1, 2, 3, ...] 103 is calculated. Herein, the deposition element group (a) 108 is assumed to be Si. It should be noted that, unlike the $R_{n-a}$ 801, the $R_{n-u}$ 802 is not a sputtering rate of the thickness of 0.3 nm, but the sputtering rate obtained from a sufficiently thick region constituting the regions $R_n$ [n=1, 2, 3, ...] 103, and hence is not a numerical value obtained from the same thickness.

Table 3 shows calculated values $R_{n-Si}/R_{n-u}$ obtained through division.

TABLE 3

| ELEMENT IN REGION $R_n$ | SPUTTERING RATE $[R_{n-Si}]$ | SPUTTERING RATE $[R_{n-u}]$ | SPUTTERING RATE $[R_{n-Si}/R_{n-u}]$ |
|---|---|---|---|
| Mg | 9.64E-04 | 3.60E-03 | 2.68E-01 |
| Al | 1.87E-03 | 5.92E-04 | 3.16E+00 |
| Si | 1.77E-03 | 4.25E-04 | 4.16E+00 |
| Ti | 9.04E-03 | 4.04E-04 | 2.24E+01 |
| V | 1.34E-02 | 2.02E-04 | 6.63E+01 |
| Cr | 1.65E-02 | 1.39E-03 | 1.19E+01 |
| Mn | 1.89E-02 | 5.77E-04 | 3.28E+01 |
| Fe | 1.99E-02 | 1.52E-03 | 1.31E+01 |
| Co | 2.40E-02 | 2.49E-04 | 9.64E+01 |
| Ni | 2.30E-02 | 1.08E-03 | 2.13E+01 |
| Cu | 2.80E-02 | 9.53E-04 | 2.94E+01 |
| Zn | 2.56E-02 | 4.80E-03 | 5.33E+00 |
| Ge | 2.83E-02 | 1.54E-02 | 1.84E+00 |
| Zr | 5.81E-02 | 1.23E-03 | 4.72E+01 |
| Nb | 6.60E-02 | 4.50E-04 | 1.47E+02 |
| Mo | 7.78E-02 | 4.67E-04 | 1.67E+02 |
| Ru | 8.90E-02 | 4.21E-04 | 2.11E+02 |
| Rh | 9.09E-02 | 6.86E-04 | 1.33E+02 |
| Pd | 9.07E-02 | 2.69E-03 | 3.37E+01 |
| Ag | 9.06E-02 | 5.31E-03 | 1.71E+01 |
| Cd | 9.15E-02 | 1.81E-02 | 5.06E+00 |
| In | 8.64E-02 | 1.23E-02 | 7.02E+00 |

TABLE 3-continued

| ELEMENT IN REGION $R_n$ | SPUTTERING RATE $[R_{n-Si}]$ | SPUTTERING RATE $[R_{n-u}]$ | SPUTTERING RATE $[R_{n-si}/R_{n-u}]$ |
|---|---|---|---|
| Sn | 9.10E−02 | 1.02E−02 | 8.92E+00 |
| Sb | 8.79E−02 | 1.47E−02 | 5.98E+00 |
| Hf | 1.64E−01 | 2.15E−03 | 7.63E+01 |
| Ta | 1.88E−01 | 7.45E−04 | 2.52E+02 |
| W | 2.00E−01 | 3.88E−04 | 5.15E+02 |
| Re | 1.98E−01 | 3.38E−04 | 5.86E+02 |
| Os | 1.96E−01 | 3.28E−04 | 5.98E+02 |
| Ir | 1.91E−01 | 7.34E−04 | 2.60E+02 |
| Pt | 2.01E−01 | 1.57E−03 | 1.28E+02 |
| Au | 2.19E−01 | 7.94E−03 | 2.76E+01 |
| Pb | 1.54E−01 | 1.72E−02 | 8.95E+00 |
| Bi | 1.40E−01 | 1.87E−02 | 7.49E+00 |

It is understood from the above Table that, in most cases, the sputtering rate of Si on the outermost surface becomes large. Under only the condition that the regions $R_n$ [n=1, 2, 3, ...] 103 is composed of Mg, the sputtering rate of Mg is large with respect to the sputtering rate of the deposition element Si, and the ratio thereof is 0.268. For example in the case of Ge, the ratio thereof is 1.84.

At this time, it is confirmed that the surface of Si deposited on Mg is rough, and the roughness of the interface between Mg and Si, in particular, is conspicuous. It is also confirmed that large surface roughness is not found in Si deposited on Ge, and the interface therebetween is almost flat. That is, it is not favorable to constitute region constituent elements with a sputtering rate higher than that of the outermost surface.

It is understood from the above result that the ratio of the sputtering rate of the material of the regions $R_n$=[n=1, 2, 3, ...] 103 constituting a base plate to that of the deposition element group (a) 108 can be an index showing the satisfactory/unsatisfactory selective film deposition.

That is, it is desirable that $R_{n-a}/R_{n-u}>1$ be satisfied.

It should be noted that this is not an absolutely necessary condition, but one of the conditions for allowing the selective film deposition of the present invention to proceed smoothly.

Further, in the present invention, as illustrated in FIG. 8, the sputtering rate of the surface one layer is expressed as $R_{n-a}$ 801, and the total sputtering rate of the materials constituting the regions $R_n$ [n=1, 2, 3, ...] 103 under the surface one layer is expressed as $R_{n-u}$ 802. The sputtering rate of the present invention is different from the conventional sputtering rate illustrated in FIG. 6A.

As described above, according to the selective film deposition method of the present invention, an indefinite number of combinations can be used depending on the difference between the regions $R_n$ [n=1,2, 3 ...] 103 and the deposition element group (a) 108. The concept of the sputtering rate of the present invention is calculated with respect to various kinds of materials and made into a database, whereby a combination of materials can be found effectively. Further, the database can be stored in a recording device for appropriate search by an information processing device.

EXAMPLES

Hereinafter, the present invention will be described more specifically by way of examples.

Example 1

Example 1 shows whether or not the selective film deposition can be performed in a particular region by the irradiation of ions and the irradiation of a deposition element to a substrate.

A vacuum chamber having an ion source capable of ionizing and radiating a noble gas and a cathode for magnetron sputtering is prepared, and a substrate is placed at a position where both irradiations can be performed. At this time, a target attached to the cathode is set to be Si, and five kinds of noble gas elements He, Ne, Ar, Kr, and Xe are prepared. Further, on the outermost surface of the substrate, a Pt region and a Ti region are formed. That is, $R_1$ is Pt and $R_2$ is Ti in FIG. 1. Next, a film was deposited under the condition that the energy of irradiation ion particles to the substrate was 50 eV, the irradiation amount was 100 [ions/sec·nm$^2$], and the irradiation rate of Si ejected out of the cathode to the substrate was 4.5 [atoms/sec·nm$^2$]. At this time, irrespective of the kind of the five kinds of noble gas elements, Si is not deposited on Pt and Si is deposited only on Ti in all the gas species. Thus, the selective film deposition can be confirmed to be achieved.

Example 2

Example 2 shows a case where a film is deposited by sputtering, in particular, the irradiation of ions is also performed by applying a bias from a magnetron cathode to a substrate.

First, an Si target of 4 inches is attached to a cathode of an RF magnetron sputtering apparatus. The distance between the cathode and the substrate is set to be about 90 mm, and the bias to be applied to the substrate is set to be 50 V. The gas species are argon and set to be 0.1 Pa during the process. This is because it is presumed that the ionized argon of the process gas has an energy of about 50 eV when being accelerated from the cathode to the substrate at 50 V by the application of a bias. Further, an RF power of 100 W is input to the Si target with a diameter of 4 inches.

In this case, it is found from the value of a current flowing during the application of a bias that the injection rate of the argon ions to the substrate is 77.1 [ions/sec·nm$^2$], and it is also found that the irradiation rate of Si ejected out of the cathode is 7.42 [atoms/sec·nm$^2$]. At this time, in a case where such a substrate that a partial region of the substrate is Pt and the other regions are Ti is used as in Example 1, it can be confirmed that Si does not adhere onto Pt but adheres onto Ti.

It is understood from the above result that the irradiation of ions and the irradiation of a deposition element can be replaced with introduction of ions from the cathode of the sputtering by the application of a bias from the cathode.

Example 3

Example 3 shows the validity of using simulation results for calculation of a sputtering rate.

The validity is confirmed by exemplifying a case where noble gas ions of Example 1 are Ar.

First, the sputtering rate $R_{n-a}$ in a case where Ar ions of 50 eV are made incident under the condition that Si is deposited to 0.3 nm on Pt as illustrated in FIG. 8 is calculated by simulation to be 2.01×10$^{-1}$. Further, the sputtering rate in a case where Ar ions of 50 eV are made incident under the condition that Si is deposited to 0.3 nm on Ti is calculated by simulation to be 9.04×10$^{-3}$ Accordingly, the irradiation rate of ion particles according to Example 1 is set to be 100 [ions/sec·nm$^2$]. The release rate of Si deposited on Pt and the release rate of Si deposited on Ti can be calculated to be 20.1 [atoms/sec·nm$^2$] and 0.904 [atoms/sec·nm/], respectively. Since the deposition rate of Si in Example 1 was 4.5 [atoms/sec·nm$^2$], it is understood that the deposition does not occur on Pt with the release being dominant, and the deposition on Ti proceeds.

Accordingly, the compatibility between the simulation and the experiment can be confirmed.

Example 4

Example 4 relates to the conditions for elements whose release rates are similar to each other, and to one of conditions for achieving the selective film deposition of the present invention.

The simulation is performed in the same manner as in Example 3. It is assumed that Si is deposited to 0.3 nm on Mg, Al, Si, Ti, V, Cr, Mn, Fe, Co, Ni, Cu, Zn, Ge, Zr, Nb, Mo, Ru, Rh, Pd, Ag, Cd, In, Sn, Sb, Hf, Ta, W, Re, Os, Ir, Pt, Au, Pb, and Bi. The sputtering rates $R_{n-a}$ in the case where Ar ions of 50 eV are incident perpendicularly are calculated, whereby values shown in Table 4 are obtained.

TABLE 4

| ELEMENT IN REGION $R_n$ | SPUTTERING RATE $R_{n-Si}$ |
|---|---|
| Mg | 9.64E−04 |
| Al | 1.87E−03 |
| Si | 1.77E−03 |
| Ti | 9.04E−03 |
| V | 1.34E−02 |
| Cr | 1.65E−02 |
| Mn | 1.89E−02 |
| Fe | 1.99E−02 |
| Co | 2.40E−02 |
| Ni | 2.30E−02 |
| Cu | 2.80E−02 |
| Zn | 2.56E−02 |
| Ge | 2.83E−02 |
| Zr | 5.81E−02 |
| Nb | 6.60E−02 |
| Mo | 7.78E−02 |
| Ru | 8.90E−02 |
| Rh | 9.09E−02 |
| Pd | 9.07E−02 |
| Ag | 9.06E−02 |
| Cd | 9.15E−02 |
| In | 8.64E−02 |
| Sn | 9.10E−02 |
| Sb | 8.79E−02 |
| Hf | 1.64E−01 |
| Ta | 1.88E−01 |
| W | 2.00E−01 |
| Re | 1.98E−01 |
| Os | 1.96E−01 |
| Ir | 1.91E−01 |
| Pt | 2.01E−01 |
| Au | 2.19E−01 |
| Pb | 1.54E−01 |
| Bi | 1.40E−01 |

In the case of Pt and Ti, the selective film deposition is achieved without any problem owing to the sufficient difference in sputtering rate. However, it is understood that the selective film deposition cannot be performed in the case of Pt and Ta. The reason for this is as follows. The selective film deposition can be performed in terms of numerical values. However, a margin of about 1.07 is small even if the irradiation rate of the deposition element Si is optimized, considering the fluctuation of the irradiation of ions and the like. Further, in the case of Pt and Hf, the ratio of sputtering rates is about 1.23. In this case, it is confirmed that the selective film deposition can be performed by optimizing the irradiation rate of the deposition element Si. Needless to say, the experimental condition at this time is such that the argon ions are accelerated by the application of a bias at 50 V and a pressure of 0.1 Pa is maintained during the process. In other words, the substrate is irradiated with the argon ions at 77.1 [ions/sec·nm$^2$].

The inventors of the present invention made extensive studies based on the above, and found that the ratio of the sputtering rates of at least 1.2 is a necessary condition for achieving the selective film deposition. Thus, the sputtering rates in the region $R_n$ and another region $R_{n'}$ constituting a part of the substrate are respectively expressed as $R_{n-a}$ [atoms/ion] and $R_{n'-a}$ [atoms/ion]. Then, as the first important conclusion of the present invention, $R_{n-a}/R_{n'-a}>1.2$, is obtained.

As the $R_{n-a}/R_{n'-a}$ being larger, the selectivity becomes higher, so it can be confirmed that the above-mentioned situation is favorable in terms of the increase in a margin.

Example 5

Example 5 shows the relationship for achieving the selective film deposition of the present invention in terms of the irradiation amount of a deposition element and the irradiation amount of ions.

Subsequent to the conclusion $R_{n-a}/R_{n'-a}>1.2$ in Example 4, the irradiation amount $S_a$ [atoms/sec·nm$^2$] of a deposition element group and the irradiation amount $G_{ion}$ [ions/sec·nm$^2$] of ions with respect to a substrate are defined. The sputtering rates of the deposition element 'a' under the condition that the deposition element group (a) is deposited to 0.3 nm in one region $R_n$ and another region $R_{n'}$ on the substrate are respectively defined to be $R_{n-a}$ [atoms/ion] and $R_{n'-a}$ [atoms/ion] ($R_{n-a}/R_{n'-a}>1.2$). In this case, in order not to allow the deposition element group (a) to be deposited on $R_{n-a}$ but to allow the deposition element group (a) to be deposited on $R_{n'-a}$, it is necessary to satisfy the following condition:

$$S_a[\text{atoms/sec·nm}^2] < R_{n-a}[\text{atoms/ion}] \cdot G_{ion}[\text{ions/sec·nm}^2]$$

$$S_a[\text{atoms/sec·nm}^2] > R_{n'-a}[\text{atoms/ion}] \cdot G_{ion}[\text{ions/sec·nm}^2]$$

It can be confirmed that the selective film deposition of the present invention can be performed by selecting $G_{ion}$, $S_a$, $R_{n-a}$, and $R_{n'-a}$ so as to satisfy the above relational expressions. The release rate of Si on Pt and the release rate of Si on Ti are respectively calculated to be 20.1 [atoms/sec·nm$^2$] and 0.904 [atoms/sec·nm$^2$] in Example 3. This is also verified from Example 1 where the deposition does not occur on Pt with the release being dominant and the deposition proceeds on Ti, when the deposition rate of Si is 4.5 [atoms/sec·nm$^2$].

Example 6

Example 6 shows the condition under which the selective film deposition of the present invention proceeds effectively.

The sputtering rate (defined as $R_{n-a}$) of an element constituting $R_n$ under the condition that the deposition element 'a' is deposited to 0.3 nm in the region $R_n$ is calculated by numerical calculation, in addition to the sputtering rate ($R_{n-a}$) of the deposition element shown in Example 4. Herein, the deposition element is assumed to be Si.

Further, Table 5 shows the calculated $R_{n-Si}/R_{n-u}$.

TABLE 5

| ELEMENT IN REGION $R_n$ | SPUTTERING RATE [$R_{n-Si}$] | SPUTTERING RATE [$R_{n-u}$] | SPUTTERING RATE [$R_{n-Si}/R_{n-u}$] |
|---|---|---|---|
| Mg | 9.64E−04 | 3.60E−03 | 2.68E−01 |
| Al | 1.87E−03 | 5.92E−04 | 3.16E+00 |
| Si | 1.77E−03 | 4.25E−04 | 4.16E+00 |
| Ti | 9.04E−03 | 4.04E−04 | 2.24E+01 |
| V | 1.34E−02 | 2.02E−04 | 6.63E+01 |

TABLE 5-continued

| ELEMENT IN REGION $R_n$ | SPUTTERING RATE $[R_{n-Si}]$ | SPUTTERING RATE $[R_{n-u}]$ | SPUTTERING RATE $[R_{n-si}/R_{n-u}]$ |
|---|---|---|---|
| Cr | 1.65E−02 | 1.39E−03 | 1.19E+01 |
| Mn | 1.89E−02 | 5.77E−04 | 3.26E+01 |
| Fe | 1.99E−02 | 1.52E−03 | 1.31E+01 |
| Co | 2.40E−02 | 2.49E−04 | 9.64E+01 |
| Ni | 2.30E−02 | 1.08E−03 | 2.13E+01 |
| Cu | 2.80E−02 | 9.53E−04 | 2.94E+01 |
| Zn | 2.56E−02 | 4.80E−03 | 5.33E+00 |
| Ge | 2.83E−02 | 1.54E−02 | 1.84E+00 |
| Zr | 5.81E−02 | 1.23E−03 | 4.72E+01 |
| Nb | 6.60E−02 | 4.50E−04 | 1.47E+02 |
| Mo | 7.78E−02 | 4.67E−04 | 1.67E+02 |
| Ru | 8.90E−02 | 4.21E−04 | 2.11E+02 |
| Rh | 9.09E−02 | 6.86E−04 | 1.33E+02 |
| Pd | 9.07E−02 | 2.69E−03 | 3.37E+01 |
| Ag | 9.06E−02 | 5.31E−03 | 1.71E+01 |
| Cd | 9.15E−02 | 1.81E−02 | 5.06E+00 |
| In | 8.64E−02 | 1.23E−02 | 7.02E+00 |
| Sn | 9.10E−02 | 1.02E−02 | 8.92E+00 |
| Sb | 8.79E−02 | 1.47E−02 | 5.98E+00 |
| Hf | 1.64E−01 | 2.15E−03 | 7.63E+01 |
| Ta | 1.88E−01 | 7.45E−04 | 2.52E+02 |
| W | 2.00E−01 | 3.88E−04 | 5.15E+02 |
| Re | 1.98E−01 | 3.38E−04 | 5.86E+02 |
| Os | 1.96E−01 | 3.28E−04 | 5.98E+02 |
| Ir | 1.91E−01 | 7.34E−04 | 2.60E+02 |
| Pt | 2.01E−01 | 1.57E−03 | 1.28E+02 |
| Au | 2.19E−01 | 7.94E−03 | 2.76E+01 |
| Pb | 1.54E−01 | 1.72E−02 | 8.95E+00 |
| Bi | 1.40E−01 | 1.87E−02 | 7.49E+00 |

It is understood from the above Table that, in most cases, the sputtering rate of Si on the outermost surface becomes large. Under only the condition that the region $R_n$ is comprised of Mg, the sputtering rate of Mg is large with respect to the sputtering rate of the deposition element Si, and the ratio thereof is 0.268. In the case of Ge, the ratio thereof is 1.84.

Under this situation, whether or not the selective film deposition can be performed under the situation similar to that in Example 2 is verified. An Si target of 4 inches is attached to a cathode of an RF magnetron sputtering apparatus. The distance between the cathode and the substrate is set to be about 90 mm, and the bias to be applied to the substrate is set to be 50 V. The gas species is set to be argon and 0.1 Pa is maintained during the process. Further, an RF power of 100 W is input to the Si target with a diameter of 4 inches.

As a substrate, Mg and Ge are provided. Film deposition is performed under the condition that Si becomes deposited. At this time, it is confirmed that the surface of Si deposited on Mg is rough, and the roughness of an interface between Mg and Si, in particular, is conspicuous. It is also confirmed that large surface roughness is not found in Si deposited on Ge, and the interface therebetween is almost flat.

It is understood from the above result that the ratio of the sputtering rate of the material of the regions $R_n$ constituting a substrate to that of the deposition element group can be an index showing satisfactory/unsatisfactory selective film deposition.

That is, it is confirmed that $R_{n-d}/R_{n-u}>1$ is desirably satisfied.

Example 7

Example 7 shows the case where the constituent element group in the region $R_n$ is an oxide.

First, a substrate of which the region constituent elements are comprised of $SiO_2$ and $Ta_2O_5$ is prepared, and the sputtering rates under the condition that Si is deposited on each of them to 0.3 nm is calculated as shown in Table 6.

TABLE 6

| ELEMENT IN REGION $R_n$ | SPUTTERING RATE $[R_{n-Si}]$ |
|---|---|
| $SiO_2$ | 5.63E−04 |
| $Ta_2O_5$ | 4.90E−02 |

In the experiment, an Si target of 4 inches is attached to a cathode of an RF magnetron sputtering apparatus. The distance between the cathode and the substrate is set to be about 90 mm, as the bias to be applied to the substrate, an RF power of 50 W is input. The gas species is set to be argon and 0.1 Pa is maintained during the process. Further, an RF power of 100 W is input to a target. At this time, although how much ions flow into the substrate cannot be presumed due to the RF bias, it can be confirmed that the adhesion of Si on $SiO_2$ is found, and the adhesion of Si on $Ta_2O_5$ is not found.

Thus, even if the substrate is of an oxide, the ratio between $5.63\times10^{-4}$ and $4.90\times10^{-2}$ calculated by numerical calculation is about 87-fold, which shows that the selective film deposition can be achieved sufficiently.

Example 8

Example 8 shows the case where the constituent element group is of the two element system of AlSi. An AlSi film has a phase separation structure including Al as a cylinder and Si as a matrix, which is a characteristic feature of the AlSi film.

First, a substrate of which the region constituent elements are comprised of Ti and Pt is prepared, and the sputtering rates under the condition that Al and Si are respectively deposited on Ti and Pt to 0.3 nm is calculated as shown in Table 7.

TABLE 7

| ELEMENT IN REGION $R_n$ | SPUTTERING RATE $[R_{n-Al}]$ | SPUTTERING RATE $[R_{n-si}]$ |
|---|---|---|
| Ti | 3.35E−02 | 9.04E−03 |
| Pt | 3.27E−01 | 2.01E−01 |

Then, in the experiment, an AlSi (composition ratio 1:1) target is attached to a cathode of an RF magnetron sputtering apparatus. The distance between the cathode and the substrate is set to be about 90 mm, and the bias to be applied to the substrate is set to be 50 V. Further, the gas species is set to be argon and 0.1 Pa is maintained during the process. This is because it is presumed that the ionized argon of the process gas has an energy of about 50 eV when being accelerated from the cathode to the substrate at 50 V by the application of the bias. Further, an RF power of 100 W is input to the target.

In this case, it is found from the value of a current flowing during the application of the bias that the injection rate of the argon ions to the substrate is 77.1 [ions/sec·nm$^2$], and is found that the irradiation rate of AlSi ejected out of the cathode is 7.42 [atoms/sec·nm$^2$].

At this time, there is no adhesion of AlSi in the region of Pt on the substrate, and the adhesion of AlSi can be confirmed in the region of Ti. Herein, assuming that AlSi falling on the substrate flies in a ratio of 1:1, the injection rate of the argon ions is 77.1 [ions/sec·nm$^2$]. A half of the argon ions falls on Al on Pt, and the release rate of Al is about 12.6 [atoms/sec·nm$^2$]. Similarly, the release rate of Si is about 7.7 [atoms/sec·nm$^2$].

Further, the release rate of Al on Ti is about 1.3 [atoms/sec·nm$^2$], and the release rate of Si thereon is about 0.3 [atoms/sec·nm$^2$] Thus, the added release rate on Pt is about 20.3 [atoms/sec·nm$^2$] in terms of AlSi, and the added release rate on Ti is about 1.6 [atoms/sec·nm$^2$] in terms of AlSi. Thus, it can be confirmed that the actual irradiation rate of AlSi of 7.42 [atoms/sec·nm$^2$] satisfies the condition shown in Example 5.

Accordingly, the deposition element group including a plurality of elements as well as the deposition element group including a single element enable selective film deposition of the present invention, as long as the condition is satisfied, and can have selectivity while exhibiting a phase separation structure.

Example 9

Example 9 shows that $R_{n-a}$ and $R_{n-u}$ can be numerically calculated with respect to a definite number of material systems and formed into a database.

First, examples of the parameter include element group and deposition element group (a) constituting energy/region of gas species/ionized particles. First, He, Ne, Ar, Kr, and Xe are selected as a gas species, and the element group and deposition element group (a) constituting the regions are selected arbitrarily from Mg, Al, Si, Ti, V, Cr, Mn, Fe, Co, Ni, Cu, Zn, Ge, Zr, Nb, Mo, Ru, Rh, Pd, Ag, Cd, In, Sn, Sb, Hf, Ta, W, Re, Os, Ir, Pt, Au, Pb, and Bi. Regarding the case where the energy of ions is 50 eV, numerical calculation is conducted. With respect to one gas species, 1156 (34×34) numerical values are obtained, and when numerical calculation is performed with respect to all the gas species, 5780 data are obtained. When possible combinations of materials are selected so as to satisfy the conditions in Examples 4, 5, and 6, it can be confirmed that a definite number of combinations can be derived.

Thus, for the selection of materials and conditions enabling the selective film deposition of the present invention a database is built, whereby a combination can be selected efficiently. Further, a search system can also be constructed by a recording device storing the database and an information processing device. Needless to say, the energy of ions is not limited to 50 eV, and the selective film deposition can be performed with any energy and incident angle, and the elements are not limited to being comprised of a single element.

The present invention provides a novel method capable of selectively depositing a film by the conventional physical vapor deposition (PVD), particularly, by sputtering, without complicated handling of source material gases or byproducts as in the chemical vapor deposition (CVD). Such method can be used for a method of forming a film.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-129297, filed May 8, 2006 which is hereby incorporated by reference herein in its entirety.

What is claimed is:

1. A method of forming a film comprising the steps of:
preparing a base plate having a first oxide region and a second oxide region composed of mutually different oxide materials; and
selectively conducting a film deposition on the second oxide region by a bias sputtering,
wherein $R_{1-a}/R_{2-a} > 1.2$, $S_a < R_{1-a} \cdot G_{ion}$, and $S_a > R_{2-a} \cdot G_{ion}$, and wherein $R_{1-a}$ is a sputtering rate of a material (a) when the material (a) is deposited with a thickness of 0.3 nm on the first oxide region, $R_{2-a}$ is a sputtering rate of the material (a) when the material (a) is deposited with a thickness of 0.3 nm on the second oxide region, $S_a$ is an irradiation amount of the material (a) to be deposited on the base plate, and $G_{ion}$ is an irradiation amount of ions of a gas species to the base plate, and wherein a film deposition rate of depositing a first atomic layer on the first oxide region is smaller than 0, and a film deposition rate of depositing a first atomic layer on the second oxide region is larger than 0, wherein $S_a - R_{1-a} \cdot G_{ion}$ is the film deposition rate of depositing the first atomic layer on the first oxide region, and $S_a - R_{2-a} \cdot G_{ion}$ is the film deposition rate of depositing the first atomic layer on the second oxide region.

2. The method of forming a film according to claim 1, wherein the material (a) to be deposited by the bias sputtering is a metal material.

3. The method of forming a film according to claim 1, wherein, in the step of selectively conducting the film deposition on the second oxide region by the bias sputtering, $R_{1-a}/R_{1-1} > 1$ and $R_{2-a}/R_{2-2} > 1$ are satisfied, wherein $R_{1-1}$ is a sputtering rate of a material (1) on the first oxide region, and $R_{2-2}$ is a sputtering rate of a material (2) on the second oxide region.

4. A method of forming a film according to claim 1, wherein, in the step of selectively conducting a film deposition on the second oxide region by the bias sputtering, $R_{1-a}/R_{2-a} \geq 87$ is satisfied.

5. A method of forming a film consisting of the steps of:
preparing a base plate having a first oxide region and a second oxide region composed of mutually different oxide materials; and
selectively conducting a film deposition on the second oxide region by a bias sputtering,
wherein $R_{1-a}/R_{2-a} > 1.2$, $S_a < R_{1-a} \cdot G_{ion}$, and $S_a > R_{2-a} \cdot G_{ion}$, and wherein $R_{1-a}$ is a sputtering rate of a material (a) when the material (a) is deposited with a thickness of 0.3 nm on the first oxide region, $R_{2-a}$ is a sputtering rate of the material (a) when the material (a) is deposited with a thickness of 0.3 nm on the second oxide region, $S_a$ is an irradiation amount of the material (a) to be deposited on the base plate, and $G_{ion}$ is an irradiation amount of ions of a gas species to the base plate, and wherein a film deposition rate of depositing a first atomic layer on the first oxide region is smaller than 0, and a film deposition rate of depositing a first atomic layer on the second oxide region is larger than 0, wherein $S_a - R_{1-a} \cdot G_{ion}$ is the film deposition rate of depositing the first atomic layer on the first oxide region, and $S_a - R_{2-a} \cdot G_{ion}$ is the film deposition rate of depositing the first atomic layer on the second oxide region.

* * * * *